(12) United States Patent
Shamoun et al.

(10) Patent No.: US 6,878,950 B2
(45) Date of Patent: Apr. 12, 2005

(54) METHOD OF REDUCING HEAT-INDUCED DISTORTION OF PHOTOMASKS DURING LITHOGRAPHY

(75) Inventors: Bassam Shamoun, Hayward, CA (US); David Trost, Hayward, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/844,223

(22) Filed: May 12, 2004

(65) Prior Publication Data

US 2004/0206912 A1 Oct. 21, 2004

Related U.S. Application Data

(60) Continuation of application No. 10/337,090, filed on Jan. 6, 2003, which is a division of application No. 09/451,683, filed on Nov. 30, 1999, now Pat. No. 6,521,901.
(60) Provisional application No. 60/154,965, filed on Sep. 20, 1999.

(51) Int. Cl.$^7$ ............................ G01B 11/26; H01J 37/00
(52) U.S. Cl. ............................ 250/492.2; 250/492.1; 250/440.11; 250/441.11; 250/442.11
(58) Field of Search .................... 250/491.1, 492.1, 250/492.2, 492.22, 392, 358, 565.1, 515.1

(56) References Cited

U.S. PATENT DOCUMENTS

| | | | |
|---|---|---|---|
| 4,916,322 A | 4/1990 | Glavish et al. | 250/492.2 |
| 5,834,785 A | 11/1998 | Coon | 250/492.2 |
| 5,847,959 A | 12/1998 | Veneklasen et al. | 364/468.28 |

FOREIGN PATENT DOCUMENTS

| | | | |
|---|---|---|---|
| GB | 2351567 | 1/2001 | G03F/7/20 |
| JP | 62035360 | 2/1987 | G03F/1/00 |
| JP | 02113517 | 4/1990 | H01L/21/027 |

(Continued)

OTHER PUBLICATIONS

T. R. Groves, "Theory of beam–induced substrate heating", J. Vac. Sci. Technol. B., vol. 14, No. 6, pp. 3839–3844 (1996).

(Continued)

*Primary Examiner*—John R. Lee
*Assistant Examiner*—David A. Vanore
(74) *Attorney, Agent, or Firm*—Kenneth C. Brooks; Shirley L. Church

(57) ABSTRACT

The present invention relates generally to methods, apparatus and materials to reduce or minimize the heating of a substrate (and associated distortions of the photomask) caused by electron-beam energy deposited in the substrate during patterning. Heating of the substrate is exacerbated by radiative transfer of infrared energy from the substrate to other nearby components of the e-beam apparatus followed by reflection or re-radiation of a portion of the energy back to the substrate. The present invention provides useful materials and methods for reducing such reflection or re-radiation effects, leading to temperature stability of the substrate, reduced thermal distortion and the possibility of increased patterning accuracy. The infrared absorbing materials of the present invention also possess sufficient electrical conductivity to dissipate scattered electrons residing on the material, and sufficient thermal conductivity to dissipate heat rapidly and not result in local heating or significant temperature rise of the absorber. The semiconducting material silicon carbide (SiC) is satisfactory for the practice of the present invention. Doped SiC having altered electrical conductivity may also be used. It is shown that emission and re-absorption from the uncoated face of the substrate dominates the substrate's temperature rise.

8 Claims, 3 Drawing Sheets

FOREIGN PATENT DOCUMENTS

| | | | |
|---|---|---|---|
| JP | 07142555 | 6/1995 | ........... H01L/21/68 |
| JP | 11168056 | 6/1999 | ......... H01L/21/027 |

OTHER PUBLICATIONS

B. Shamoun et al., "Assessment of thermal loading–induced distortions in optical photomasks due to e–beam multipass patterning", J. Vac. Sci. Technol. B, vol. 16, No. 6, pp. 3558–3562 (1998).

B. Shamoun et al., "Photomask in–plane distortion induced during e–beam patterning", Proceedings of the 1998 SPIE Symposium on Emerging Lithographic Technology II, vol. 3331, pp. 275–279 (1998).

B. Shamoun et al., Experimental and Numerical Investigations of Photomask Substrate Heating Due to Electron–Beam Patterning, Abstracts of International Conference on Micro–and–Nano–Engineering 99, Rome, Italy (1999).

METHOD OF REDUCING HEAT-INDUCED DISTORTION OF PHOTOMASKS DURING LITHOGRAPHY

CROSS-REFERENCE TO RELATED APPLICATIONS

The present application is a continuation of U.S. application Ser. No. 10/337,090, filed Jan. 6, 2003, which is currently pending, which is a divisional of U.S. application Ser. No. 09/451,683, filed Nov. 30, 1999, which issued as U.S. Pat. No. 6,521,901, on Feb. 18, 2003, and which claims priority to U.S. Provisional Patent Application No. 60/154,965, filed Sep. 20, 1999. All three of the priority applications are incorporated by reference herein.

BACKGROUND OF THE INVENTION

1. Technical Field

The present invention relates to the general field of patterning by means of lithography. More particularly, the present invention relates to the thermal distortion of the photomask caused by substrate heating during electron beam patterning and to procedures, apparatus and materials for reducing heat-induced photomask distortion, leading to increased patterning accuracy.

2. Description of Related Art

The production of precise patterns on surfaces is a necessary stage in the fabrication of integrated circuits, and finds applicability in many other commercial environments as well. The typical method for creating such patterns is to coat the surface to be patterned with a chemical that undergoes a chemical transformation upon exposure to energy, a "resist." Positive resists undergo chemical transformation on exposure to energy leading to removal of resist from the surface to be etched in the regions so exposed. Negative resists undergo other chemical transformations, such as cross-linking, leading to removal of resist in regions not exposed to energy. Both positive and negative resists are commercially useful. Thus, exposing a resist-coated surface to the appropriate pattern of energy leads to selective removal of resist according to that pattern (exposed or masked), uncovering selected regions of the underlying surface to further chemical etching in a subsequent etching step. Removal of all resist following surface etching leads to the desired pattern etched into the surface.

The energy incident on the resist is typically either electromagnetic or a beam of particles, typically ions or electrons ("e-beam"). In addition, the energy may be directed onto the resist in one of two general ways: 1) through a mask having both transparent and opaque regions therein permitting selective passage of the incident energy to create the desired pattern of exposure on the underlying resist, or 2) as a focused beam, guided so as to impact selectively only those areas requiring exposure. Exposure through a mask is the presently preferred technique for producing numerous identical patterns at reduced costs. However, the mask itself must first be made, most commonly, by focused beam impact. Thus, focused beam exposure of resists remains a necessary step in the production of masks for lithography.

Direct beam "writing" of patterns onto resists has several advantages over use of a mask. Among these are avoiding the complications of alignment and registration of the mask and more precise patterning accomplished by precisely focused beams. Thus, beam lithography finds applicability in many areas of technology in addition to mask creation. However, the discussion herein will be particularly directed to e-beam lithography for the production of masks (also called photomasks) although other applications for the methods described herein will be apparent to those having ordinary skills in the art. For economy of language we will describe e-beam lithography as typically used in the manufacture of masks, not intending thereby to limit the scope of the invention.

In order to create even more precise patterns, it is necessary to identify each source of patterning error and strive to reduce all sources of errors. In particular, one source of error in patterning results from the heating of the substrate on which the photomask is being patterned, leading to distortion of the mask, positioning error and imprecise patterning. Theoretical and computational studies of such thermal distortions have been reported by Shamoun et. al. "Assessment of Thermal Loading-Induced Distortions in Optical Photomasks due to E-Beam Multipass Patterning" appearing in *J. Vac. Science and Technology B*, Vol. 16, No. 6, pp. 3558–3562 (1998), and also "Photornask In-Plane Distortion Induced During E-Beam Patterning," appearing in *Proceedings of the* 1998 *SPIE Symposium on Emerging Lithographic Technology II*, Vol. 3331, pp. 275–279 (1998). Similar results related to thermal distortion during patterning have been reported by Groves, "Theory of Beam-Induced Substrate Heating," appearing in *J. Vac. Science and Technology B*, Vol. 14, No. 6, pp. 3839–3844 (1996).

E-beam patterning typically directs a focused beam of electrons onto a target to write the pattern in a layer of photoresist. A typical mask structure is depicted schematically (but not to scale) as 1 in FIGS. 1 and 3. The top most layer, 14 in FIG. 3, is typically the resist upon which the beam 6 writes the desired pattern. Below the photoresist 14 is typically the mask material to be patterned 13. The photomask is typically a thin layer of chromium-containing material. A substrate 10 is typically located beneath the photomask, supporting the photomask and resist layers and into which a substantial portion of the beam's energy is deposited. The substrate is typically a glass or glassy-like material. The present invention relates to the deleterious effects on the patterning process caused by energy deposited in the substrate following passage of the beam through the resist and photomask. For economy of language, we will refer to the entire structure 1 as the "mask" or "photomask" intending to encompass thereby all layers including resist 14, mask-forming material 13, and substrate 10.

To be concrete in our description, we will describe the technologically and commercially important process of electron beam ("e-beam") patterning of photomasks, as typically would be used for the fabrication of integrated circuits. However, the methods, apparatus and materials described herein for reducing thermal distortion during patterning may be used in other fields of application as apparent to those having ordinary skills in the art, and the present invention is not inherently limited to e-beam patterning of photomasks.

The thermal distortions of the substrate due to e-beam patterning are found to be a function of the system thermal boundary conditions, that is the thermal radiation absorbing/emitting properties of materials near the substrate during patterning. The thermal boundary conditions determine the rate of heat exchange between the mask and its surroundings. Since e-beam patterning is performed in a vacuum, radiative heat transfer is the dominant mode of heat exchange between the substrate and its surroundings. The rate of heat dissipation from the mask should be increased to lower the average temperature rise of the mask during patterning. We note that a uniform temperature rise of the substrate and photomask, not resulting in photomask distortion, would not be a serious problem in precise patterning as this effect is readily corrected by magnification adjustment. However, the exchange of heat energy between the substrate and its surroundings invariably results in non-uniform substrate heating and photomask distortion. Thus, reduction of thermal effects on the substrate is the preferred strategy rather than attempted uniformization of thermal effects on the substrate which is typically much more difficult.

One approach to maintaining accurate writing in the face of thermal distortions of the substrate is to calculate (or at least estimate) in real-time as the pattern is being written, the extent of thermal distortions. One then may correct the e-beam writing process to compensate for these thermal distortions. Estimation/correction is the approach taken by Veneklausen et. al. in U.S. Pat. No. 5,847,959. The present work is complimentary in that it relates to ways to minimize thermal distortion that one may additionally wish to estimate and correct. Estimation/correction in real-time becomes a more effective procedure if the corrections are as small as feasible.

Heat transfer out of the substrate is dominated by radiation, as expected for a substrate in a vacuum. The amount of heat transferred is found to be strongly dependent on the radiative properties (absorptivity/emissivity) of the material surrounding the substrate in the chamber. Although the heat deposited in the substrate is deposited pulse by pulse during e-beam patterning, and therefore has a structure and geometry within the substrate, such geometric effects are not strongly related to the overall thermal distortion of the substrate. Local deposition of heat energy (that is, pattern-dependent deposition of heat energy) rapidly dissipates (over a matter of seconds) to lead to the substantially global heating effects that are the subject of the present invention. Reduction of thermal distortion of the substrate during patterning by suppressing of radiation from the surroundings to the substrate is the subject of the present invention.

BRIEF SUMMARY OF THE INVENTION

The present invention relates generally to methods, apparatus, and materials to reduce or minimize the heating of a substrate (and associated distortions of the photomask) caused by electron-beam energy deposited during patterning. Heating of the substrate is exacerbated by radiative transfer or infrared energy from the substrate to other nearby components of the e-beam apparatus followed by reflection or re-radiation of a portion of the energy back to the substrate. The present invention provides useful materials and methods for reducing such reflection or re-radiation effects, leading to temperature stability of the substrate, reduced thermal distortion and increased patterning accuracy.

Among the objectives of the present invention are to identify and evaluate specific materials and compounds that absorb radiation emitted by the substrate (typically infrared) and make use of such materials to improve the thermal performance of the substrate underlying the photomask material and resist, minimizing or reducing in-plane distortions of the photomask material due to bulk substrate heating. The present invention meets three criteria for improving thermal performance of the substrate during the patterning process: 1) High radiative absorptivity in the infrared region of the spectrum appropriate for radiation emitted by the substrate under typical e-beam writing conditions. 2) Moderate electrical conductivity sufficient to allow scattered electrons impacting the absorptive material to be removed, avoiding thereby static charge accumulation and the possibility of degradation of e-beam writing performance. 3) High thermal conductivity of the absorptive material leading to insignificant temperature rise and the absence of localized regions of high temperature in the absorptive material itself.

The semiconducting material silicon carbide (SiC) is shown to be a satisfactory material in the practice of the present invention. SiC has the additional advantage of permitting doping with various dopants to alter the electrical conductivity. SiC may be used as a replacement material for various components of the e-beam lithography system, or as a coating on such components or as additional shielding components inserted into the apparatus. SiC may be coated directly onto the components or attached as thin tiles to provide the necessary thermal, radiative and electrical properties.

"o" is the temperature rise without SiC absorbers.

"◊" is the temperature rise with a SiC absorber facing the coated side of the substrate.

"x" is the temperature rise with a SiC absorber facing the uncoated side of the substrate.

Figure 3:
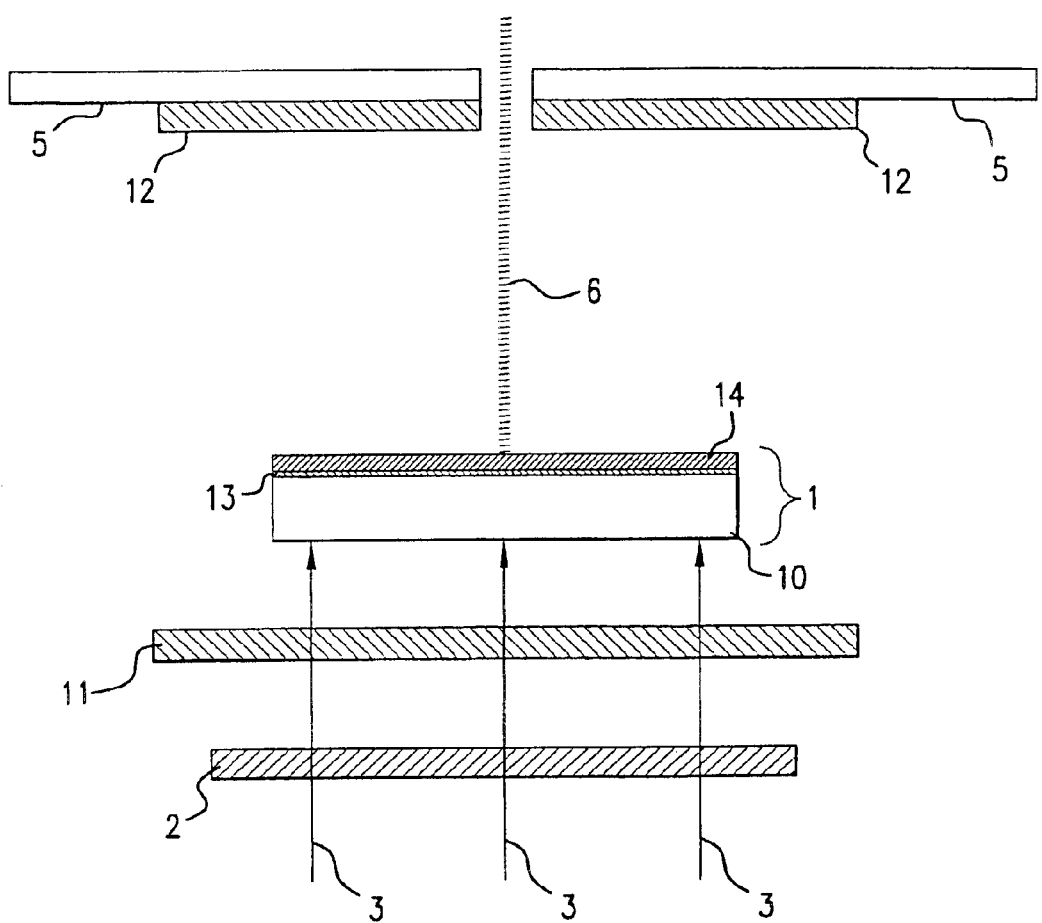

FIG. 3: Schematic cross sectional view of the shield, mask and pallet including absorbing materials. The embodiment in which absorbers are inserted as distinct components is depicted.

DETAILED DESCRIPTION OF THE INVENTION

In the following description and figures, similar reference numbers are used to identify similar elements.

Figure 1:
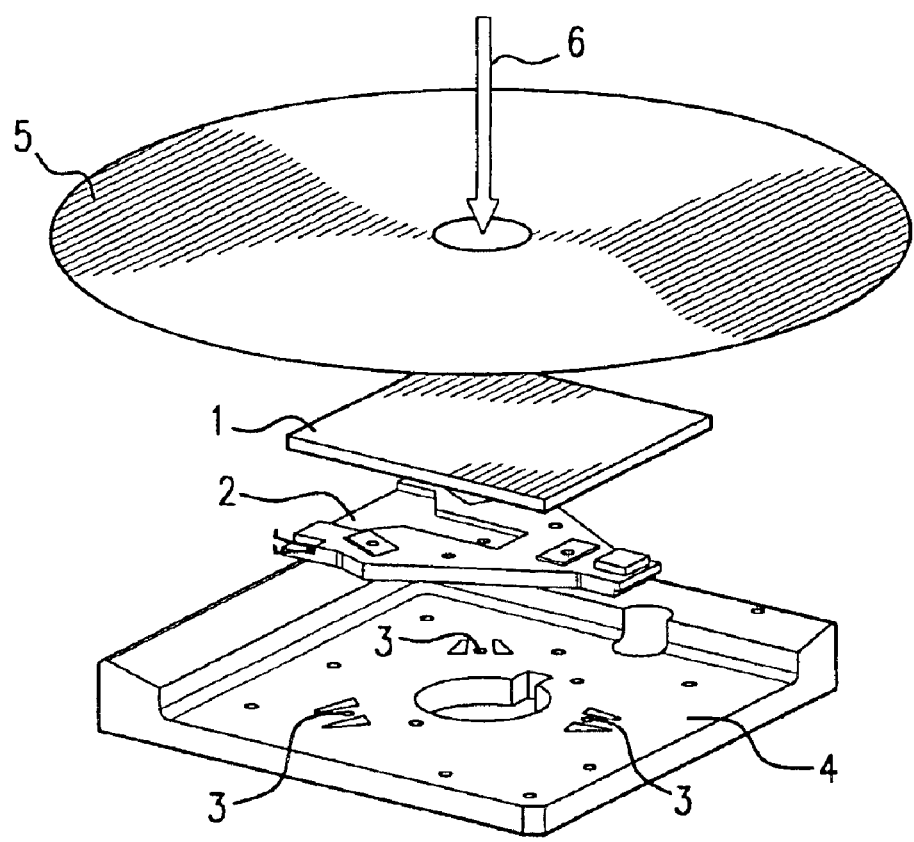
FIG. 1: Schematic, exploded depiction of the mask and nearby components of a typical electron beam lithography system.

FIG. 1 depicts schematically an exploded view of the components of a typical electron beam (e-beam) lithography system relevant for a description of the present invention. "Mask," 1 in FIG. 1 denotes the layered structure typically employed as the target of the electron beam. Mask 1 typically includes a substrate, the photomask material and a layer of photoresist. These components are depicted as substrate 10, photomask material 13 and photoresist 14 in FIG. 3. The focus of the present invention lies with the heating of the substrate material, typically glass, rather than the effect of the e-beam in writing the pattern on the photomask and photoresist. For simplicity of depiction, we denote a single structure as the "mask" in FIG. 1, intending thereby to include a multiple layered structure typically employed in e-beam lithography.

Modem technologies require very precise patterns to be written by e-beam 6 on the mask 1. Typical pattern accuracy requirements may be as rigorous as requiring pattern errors to be less than about 10 nanometers (nm). Achieving such tight error budgets requires careful attention to all sources of error in the writing process and elimination of all such errors whenever and however feasible.

One source of error is the thermal distortion of the mask 1 during the writing process. Impact by the beam of electrons during the writing process causes the temperature of the mask 1 to increase. Although the overall temperature rise of the mask 1 is typically rather small (less than about 1° C.), the distortion in the pattern may be substantial. The mask distortion of 15 nm to 20 nm due to bulk heating occurring during the writing process is typical, resulting in unacceptable errors in the pattern. Reduction of these thermal distortion errors is a major objective of the present invention.

The mask 1 typically sits atop a pallet 2 (or "carrier") and is held in a substantially fixed position with respect to the pallet by a plurality of points (typically three). These supporting points, denoted as 3 in FIGS. 1 and 3, typically anchored in mirror 4, project through holes in the pallet 2 to support and position the mask 1. Following completion of e-beam writing, the mask 1 is typically removed from the machine and replaced by another mask for writing. Alternative embodiments may entail inserting and removing the mask 1 and pallet 2 as a unit or removing and replacing the mask on the previously-employed pallet for return to the machine. For lower energy e-beam writing (for example, around 10 KeV), heating of the pallet is not typically a serious concern. When employing higher energy e-beam lithography (around 50 KeV, for example), heating of the pallet is more of a problem. However, the present invention is useful for reducing thermal distortion when applied to either or both modes of exchanging masks (with or without exchanging pallets). Hereinafter, we make no distinction in the description of the present invention whether or not pallets are exchanged along with the mask.

"Kinematic mounts" encompass the three point mount depicted in FIG. 1 as well as mounts with a different number of points, often six. Such mounts provide frictional forces to restrain the motion of the mask in its plane (r, θ directions), but only the weight of the mask maintains intimate contact with the point supports in the perpendicular (z) direction. Kinematic mounts such as these provide reliable reference positions for the mask and are the presently preferred mounting means.

However, the three point kinematic support depicted in FIG. 1 provides negligible conduction of heat through the three points in comparison with the heat transfer via radiative effects. Thus, the primary source of heat reaching the pallet is radiation from the mask. Current practice is to make the pallet with a very highly reflective upper surface at the wavelength of thermal radiation emitted by the mask (infrared, "IR"). Gold is the typical coating currently in use. This reflective coating rejects substantially all radiation energy incident on the pallet from the mask, causing the pallet to substantially retain its initial temperature before, during and after e-beam patterning of the mask it canies. Following the patterning of a mask, the mask may in some equipment be removed from the pallet and another mask placed on the pallet for patterning. If the pallet changes temperature (heats up) from run to run during a working day, subsequent masks deposited thereon for patterning will receive radiation emitted by the pallet and be distorted. Typically, the pallet and mask are separated by a few millimeters, making radiative heating of the mask a genuine concern whenever the pallet is a changeable source of IR. Thus, the use of a non-reflective pallet creates a "history problem" by which the temperature-related distortions of a mask depend on the temperature of the underlying pallet, which, in turn, depends on the patterning history of the pallet. Thus, to maintain temperature stability of the pallet, it is useful to make it reflective at the IR wavelengths of interest. In addition, a glass ceramic commercially supplied by Schott Optical Glass, Inc. under the tradename ZERODUR® is a substantially uniform material and dimensionally stable. ZERODUR® is thus a preferred pallet material at present.

Other embodiments of the present invention replace the mask and the pallet as a unit following patterning. In such cases, IR reflectivity of the pallet is less of a concern and the materials of the present invention may be utilized as a barrier between substrate and pallet, as a coating on the pallet, or for the pallet material itself.

During e-beam patterning, a beam of electrons 6 is typically directed through a shield 5 to write the desired pattern on the mask 1. Focusing and guiding the e-beam to produce the desired pattern is performed by various electron focusing and deflecting devises not the subject of the present invention and not depicted in FIG. 1. Electrons traversing from their source to impact the mask 1 may scatter and attach to various surfaces within the e-beam apparatus. A shield 5 (also termed a "magnetic shield") is commonly located above the mask as depicted in FIG. 1, typically from around 5 mm to around 15 mm distance from the mask 1. Shield 5 collects backscattered electrons from the mask and removes them by electrical connections (not shown in FIG. 1). Accumulation of static charge within the apparatus may have harmful effects on the properties of the e-beam and on the accuracy of the patterning process. Thus, surfaces within the e-beam lithography apparatus are preferably somewhat conducting, permitting the leakage of accumulating electrons away from the surface before degradation of the e-beam writing process can occur. While most materials absorbing in the infrared are insulating, this requirement of sufficient electrical conductivity for charge dissipation provides an important selection criteria in the choice of materials for use in the suppression of radiative heating according to the present invention.

It has been demonstrated by experimental measurements and by numerical heat transfer calculations that a primary source of thermal distortion of the mask 1 is the thermal radiation emitted by the mask, absorbed or reflected by portions of the apparatus in the vicinity of the mask, and returned (or re-emitted) to impact the mask and increase its temperature. Since the mask is typically at or near room temperature, radiation in the region of about 2 to about 50 micrometers, ($\mu$), peaking at approximately $10\mu$ is the predominant wavelength emitted. Such experimental and computational work demonstrates that radiation from the mask 1 impacts its surroundings, which may reflect or re-radiate the energy back to the mask 1 to cause thermal distortion. Thus, the present invention relates to absorbing materials for use within a typical e-beam lithography apparatus for absorbing radiation emitted from the mask, preventing it from reflecting or re-radiating back onto the mask and affecting the temperature of the substrate.

Radiation absorbing materials for use inside e-beam lithography equipment pursuant to the present invention will typically have several characteristics. Firstly, the materials need to absorb effectively at the wavelengths emitted by substrate materials at or near room temperature. Typically, such wavelengths are in the range of $2–50\,\mu$, peaking around $10\,\mu$. Such radiation absorbers must not themselves experience substantial temperature rise during the operation of the e-beam apparatus, including many runs over the course of a working day, typically 4–8 hours of exposure. Thus, the absorbers should have heat capacity and/or mass such that no substantial temperature rise occurs that would lead to significant re-radiation by the absorber. The preferred material in the practice of the-present invention is SiC or doped SiC. SiC has thermal conductivity or approximately 125 W/m ° K., which is adequate for the practice of the present invention.

E-beam lithography is carried out in a vacuum. Thus, in addition to its thermal and radiative properties, the absorber chosen for use in connection with e-beam lithography should maintain its properties and integrity in a vacuum. Substantial outgassing or degradation in properties in the high vacuum environment encountered in e-beam lithography would be inadvisable in the absorbing material used in connection with the present invention.

The present inventors have ascertained that silicon carbide (SiC) or doped SiC is one example of a substance giving adequate performance in the practice of the present invention. SiC is generally a semiconductor, but having sufficient conductivity to permit adequate dissipation of electrons deposited thereon. High conductivity is not necessary for the purposes of the present invention, merely the absence of high resistivity. SiC may be doped with various dopants as is well known in the semiconductor industry, altering thereby its conductivity. Increased conductivity by a factor of about a million is feasible by appropriate doping of SiC, obtaining electrical resistivity as low as 100 ohm-cm. Thus, SiC or doped SiC is a preferred material for use in the practice of the present invention.

Figure 2:
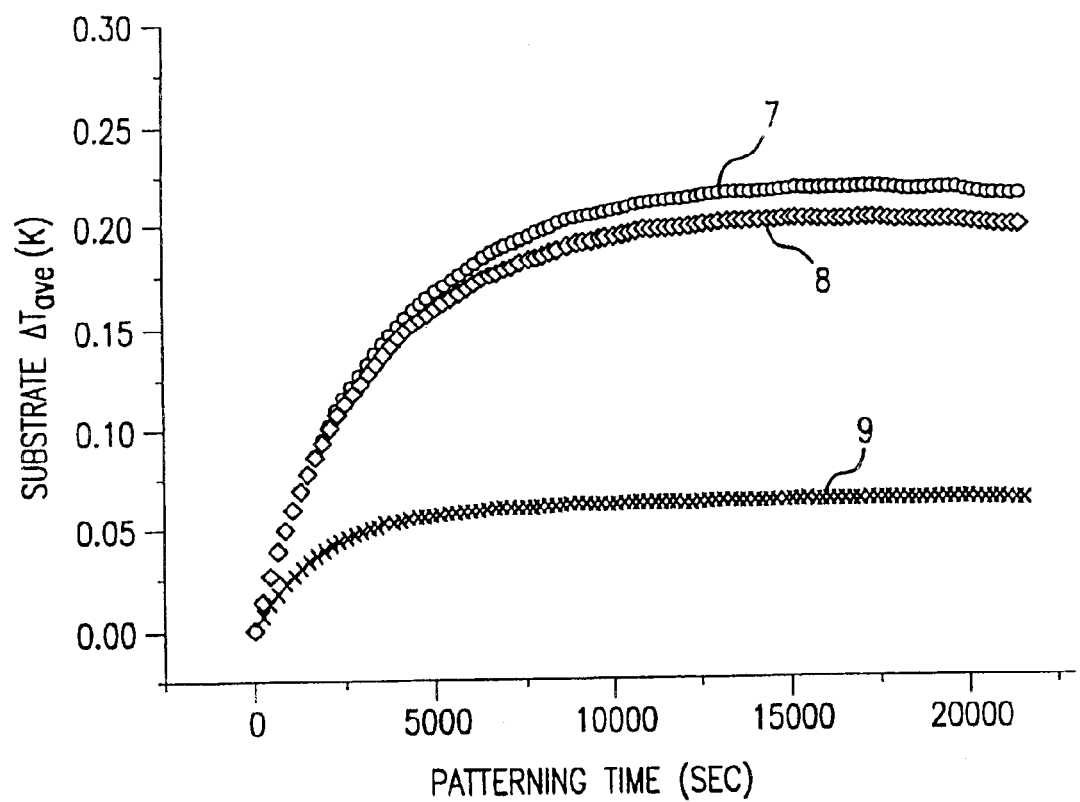
FIG. 2: Results of a finite element computer calculation of the effect of SiC absorbers on temperature rise of the substrate as a function of the time of e-beam writing.

We show in FIG. 2 computer calculations of the effect of SiC absorbers on the temperature of the mask 1 carried out with the assistance of the commercial finite element software ANSYS (Version 5.5). Curve 7 ("o") gives the temperature rise of the mask 1 as a function of time during the patterning process for typical e-beam lithography parameters. Although the temperature rise is relatively modest (about 0.20° C.), this is sufficient cause for concern in the ultimate accuracy of the e-beam patterning process.

Curve 8 in FIG. 2 ("◇") gives the results of numerical calculations for the heating of the mask 1 when a SiC absorber is placed facing the "coated" side of the mask 1. The "coated" side of the mask 1 is the side facing the shield 5, which is coated with the photomask and photoresist being written by the e-beam and denoted by 14 in FIG. 3. The uncoated side of the mask 1 is thus the side facing the pallet 2 and mirror 4, denoted as 10 in FIG. 3. FIG. 2 demonstrates that an absorbing surface above the mask 1 in the region of the shield 5 has an observable effect on the temperature stability of the mask 1 but the effect is not dramatic.

Placing a SiC absorber facing the uncoated (lower) side of the mask 1 leads to significant improvement in temperature stability of the mask. This is demonstrated by curve 9 in FIG. 2 ("x") in which a factor of about 4 improvements in temperature stability of the mask 1 is shown.

Thus, the preferred embodiment of the present invention relates to the use of SiC or doped SiC to absorb radiation emitted from the substrate. Radiation from the bottom, uncoated side of the substrate is the primary source of radiation resulting in thermal distortion, although other sources may also be suppressed by absorption. FIG. 3 depicts a schematic cross sectional view of one form such absorbing components may take. On the upper (coated) side of the mask 1 a SiC (or doped SiC) may be used as a barrier (depicted as 12 in FIG. 3). Alternatively, the magnetic shield 5 may be coated with SiC, including re-annealing of the shield 5 following SiC coating if high coating temperatures are likely to have disturbed the desired properties or microstructure of the coated part. SiC may also be attached as tiles, typically 0.1 mm to 0.2 mm in thickness, using a suitable adhesive or other binding means. In addition, the magnetic shield may be fabricated of SiC, perhaps having a metallic coating on the side away from the mask 1 to enhance electrical conductivity. All such embodiments are included within the scope of the present invention as well as modifications apparent to those having ordinary skills in the art.

Similarly, a SiC absorbing shield may be placed beneath the mask 1, having openings therein for the kinematic mounts 3 to pass through and to position the mask 1. Absorber 11 may be a separate barrier as depicted in FIG. 3, may be a coating on the pallet 2 (with re-annealing if required), may be tiles or a coating attached to the pallet 2 by a suitable adhesive, or the pallet 2 may be itself fabricated in whole or in part from the desired absorbing material, typically SiC. All such embodiments are included within the scope of the present invention as well as modifications apparent to those having ordinary skills in the art.

FIG. 1 depicts the pallet 2 as having a size smaller than, or approximately the same as, the size of the mask 1. Another embodiment of the present invention has the pallet 2 substantially larger than the mask 1 as depicted schematically in FIG. 3. A pallet much larger than the mask 1 would have at least two beneficial effects. First, a larger, more massive pallet would offer a larger thermal ballast (heat sink) for heat radiated from the mask 1. That is, heat radiated from the mask 1 would have a smaller effect on the temperature of the pallet 2 (and hence on the energy re-radiated from the pallet 2) if the pallet 2 is more massive. The second beneficial effect is geometric in that radiation emitted from a larger surface area of the pallet 2 would have a larger fraction miss striking the mask 1. That is, for a larger pallet, the mask "shadows" less of the emitted radiation, tending thereby to reduce thermal distortion of the mask 1.

The precise composition, and mode (coating, tiles, separate shield) of the absorber is not critical to the practice of the present invention so long as the three criteria of IR absorption, thermal conductivity and electrical conductivity are adequately met.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described. Rather, it is intended that the scope of the invention be determined by the appended claims.

We claim:

1. A method of reducing thermal distortion of a photomask and substrate during patterning comprising placing infrared absorbing material adjacent to the substrate, said absorbing material having a location so as to absorb substantial amounts of infrared radiation emitted from said substrate, and wherein said absorbing material has sufficient electrical conductivity to dissipate electric charge accumulating thereon, and wherein said absorbing material has sufficient thermal conductivity to dissipate heat radiatively deposited therein from said substrate without significant temperature rise.

2. A method as in claim 1 wherein said absorbing material is silicon carbide.

3. A method as in claim 1 wherein said absorbing material is doped silicon carbide.

4. A method as in claim 1 wherein said absorbing material is located adjacent to an uncoated face of said substrate.

5. A method as in claim 4 wherein said absorbing material is coated on a pallet adjacent to said substrate.

6. A method as in claim 4 wherein said absorbing material is adhesively attached to a pallet adjacent to said substrate.

7. A method as in claim 4 wherein a pallet adjacent to said substrate comprises said absorbing material.

8. A method as in claim 4 wherein a pallet adjacent to said substrate is larger than said substrate.

* * * * *